United States Patent
Kwon et al.

(10) Patent No.: US 9,337,144 B2
(45) Date of Patent: May 10, 2016

(54) E-FUSE STRUCTURE WITH METHODS OF FUSING THE SAME AND MONITORING MATERIAL LEAKAGE

(71) Applicants: International Business Machines Corporation, Armonk, NY (US); GLOBALFOUNDRIES Inc., Grand Cayman (KY); Samsung Electronics Co., Ltd., Gyeonggi-do (KR)

(72) Inventors: O Sung Kwon, Wappingers Falls, NY (US); Dan Moy, Bethel, CT (US); Kihwang Son, Schenectady, NY (US); Xiaoqiang Zhang, Rexford, NY (US)

(73) Assignees: Samsung Electronics Co., LTD., Gyeonggi-Do (KR); International Business Machines Corporation, Armonk, NY (US); GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 14/876,011

(22) Filed: Oct. 6, 2015

(65) Prior Publication Data

US 2016/0027734 A1  Jan. 28, 2016

Related U.S. Application Data

(62) Division of application No. 14/165,039, filed on Jan. 27, 2014.

(51) Int. Cl.
| | |
|---|---|
| *H01L 23/525* | (2006.01) |
| *H01L 23/532* | (2006.01) |
| *H01L 21/321* | (2006.01) |
| *H01L 23/367* | (2006.01) |
| *H01L 23/522* | (2006.01) |
| *H01L 23/528* | (2006.01) |
| *G01R 31/28* | (2006.01) |
| *H01L 21/66* | (2006.01) |

(52) U.S. Cl.
CPC .......... *H01L 23/5256* (2013.01); *H01L 21/321* (2013.01); *H01L 22/34* (2013.01); *H01L 23/367* (2013.01); *H01L 23/3677* (2013.01); *H01L 23/528* (2013.01); *H01L 23/5226* (2013.01); *H01L 23/53214* (2013.01); *H01L 23/53228* (2013.01); *H01L 23/53257* (2013.01); *G01R 31/2858* (2013.01); *H01L 22/12* (2013.01); *H01L 2924/0002* (2013.01)

(58) Field of Classification Search
None
See application file for complete search history.

(56) References Cited

U.S. PATENT DOCUMENTS

| | | |
|---|---|---|
| 5,589,706 A | 12/1996 | Mitwalsky et al. |
| 7,923,811 B1 | 4/2011 | Im et al. |

(Continued)

OTHER PUBLICATIONS

Restriction Requirement for U.S. Appl. No. 14/165,039, dated Sep. 23, 2015, 8 pages.

(Continued)

*Primary Examiner* — Jack Chen

(74) *Attorney, Agent, or Firm* — Steven J. Meyers; Hoffman Warnick LLC

(57) ABSTRACT

The present disclosure generally provides for an e-fuse structure and corresponding method for fusing the same and monitoring material leakage. The e-fuse structure can include a metal dummy structure and an electrical fuse link substantially aligned with a portion of the metal dummy structure, wherein the metal dummy structure cools at least part of the electrical fuse link in response to an electric current passing through the electrical fuse link.

11 Claims, 5 Drawing Sheets

(56) References Cited

U.S. PATENT DOCUMENTS

| | | |
|---|---|---|
| 7,986,025 B2 | 7/2011 | Kawahara |
| 8,299,567 B2 | 10/2012 | Wang et al. |
| 8,410,527 B2 | 4/2013 | Pellizzer et al. |
| 2008/0217735 A1 | 9/2008 | Chen et al. |
| 2010/0213569 A1 | 8/2010 | Wu et al. |
| 2012/0223802 A1 | 9/2012 | Shin et al. |
| 2014/0061851 A1 | 3/2014 | Lin et al. |
| 2015/0214149 A1* | 7/2015 | Moy ................... H01L 23/5256 324/762.01 |
| 2016/0027734 A1* | 1/2016 | Kwon ................ H01L 23/5256 257/529 |

OTHER PUBLICATIONS

US Patent Application No. 14/165,039, Notice of Allowance dated Feb. 5, 2016, FIS920130141US1 (Ibmf-0350), 12 pp.

* cited by examiner

E-FUSE STRUCTURE WITH METHODS OF FUSING THE SAME AND MONITORING MATERIAL LEAKAGE

BACKGROUND

Embodiments of the invention relate generally to integrated circuits and, more particularly, to the structure of an electrically programmable fuse (e-fuse) and methods of fusing an e-fuse and/or monitoring leakage in a semiconductor structure.

Many integrated circuits are made up of millions of interconnected devices, such as transistors, resistors, capacitors, and diodes, on a single chip of a semiconductor substrate. Semiconductor integrated circuits ("semiconductors") can also include one or more types of memory, such as CMOS memory, antifuse memory, and e-fuse memory.

E-fuses are usually integrated into semiconductors by using a narrow strip of conducting material (metal, polysilicon, etc.) between wiring or electrical contacts. This narrow strip of conducting material is sometimes called a "fuse link." The contacts or wiring can be in the form of two pads, sometimes referred to as "vias" or an anode/cathode pair. "Vias" can connect one layer of a semiconductor to another. Applying a programming current ($I_{prog}$) to the e-fuse destroys a portion of the link, and causes resistance of the e-fuse to greatly increase. This process can be known as "fusing" or "programming" the e-fuse. The fuse state (i.e., whether a portion of the fuse is destroyed) can be read using a sense circuit. An e-fuse can be fused by causing electromigration to occur within the fuse link, creating a "void" in all or part of the fuse link section.

Fusing an e-fuse via electromigration can offer a controlled, reliable method for fusing an e-fuse. Controlling the appearance of voids in back end of line (BEOL) fuses, however, can be difficult to achieve because of process changes during the development cycle. Specifically, improvements to back end of line manufacture and design (e.g., smaller scale devices) have caused the appearance and location of voids during fusing to become unpredictable.

SUMMARY

According to one embodiment of the present invention, an e-fuse structure may comprise a metal dummy structure; and an electrical fuse link substantially aligned with a portion of the metal dummy structure, wherein the metal dummy structure cools at least part of the electrical fuse link in response to an electric current passing through the electrical fuse link.

According to another embodiment of the present invention, a method for fusing an e-fuse may comprise obtaining a metal dummy structure in substantial alignment with a portion of an electrical fuse link of the e-fuse, wherein the electrical fuse link joins two electrodes of the e-fuse; and creating a void in a further portion of the electrical fuse link not substantially aligned with the metal dummy structure by directing an electric current through the electrical fuse link, wherein the metal dummy structure absorbs heat from the portion of the electrical fuse link substantially aligned with the metal dummy structure.

According to an additional embodiment of the present invention, a method for monitoring material leakage in a semiconductor may comprise passing a fusing current through an electrical fuse link of an e-fuse, wherein a metal dummy structure in substantial alignment with a portion of the electrical fuse link absorbs heat, and the current creates a void in a further portion the e-fuse link not substantially aligned with the metal dummy structure; applying a material leakage test voltage across the metal dummy structure; and determining a leakage of a material from the metal layer of the semiconductor based on a resultant current per length of the metal dummy structure.

BRIEF DESCRIPTION OF THE SEVERAL VIEWS OF THE DRAWINGS

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

In semiconductor processing, "Back end of line" (BEOL) processes can refer to operations performed on a semiconductor wafer in the course of device manufacturing, after a first metallization. As known in the art, "metallization" can refer to the formation of metal contacts and interconnects in the manufacturing of semiconductor devices. Use of fuses during BEOL processes is growing due to the introduction of new front end of line (FEOL) technologies (i.e., operations performed before a first metallization), such as gate-last High-K Metal Gates (HKMGs) and finFETs. These components have made silicided fuses more difficult to implement. Some fuse designs have failed to yield reproducible results, especially with changing processes and programming conditions. Specifically, the location of voids in fuses using electromigration has varied with changing processes and programming conditions.

Features of the present disclosure include an e-fuse structure. The e-fuse structure may include a metal dummy structure, and an electrical fuse link substantially aligned with a portion of the metal dummy structure. The metal dummy structure can cool at least part of the electrical fuse link in response to an electric current passing through the electrical fuse link.

Figure 1:
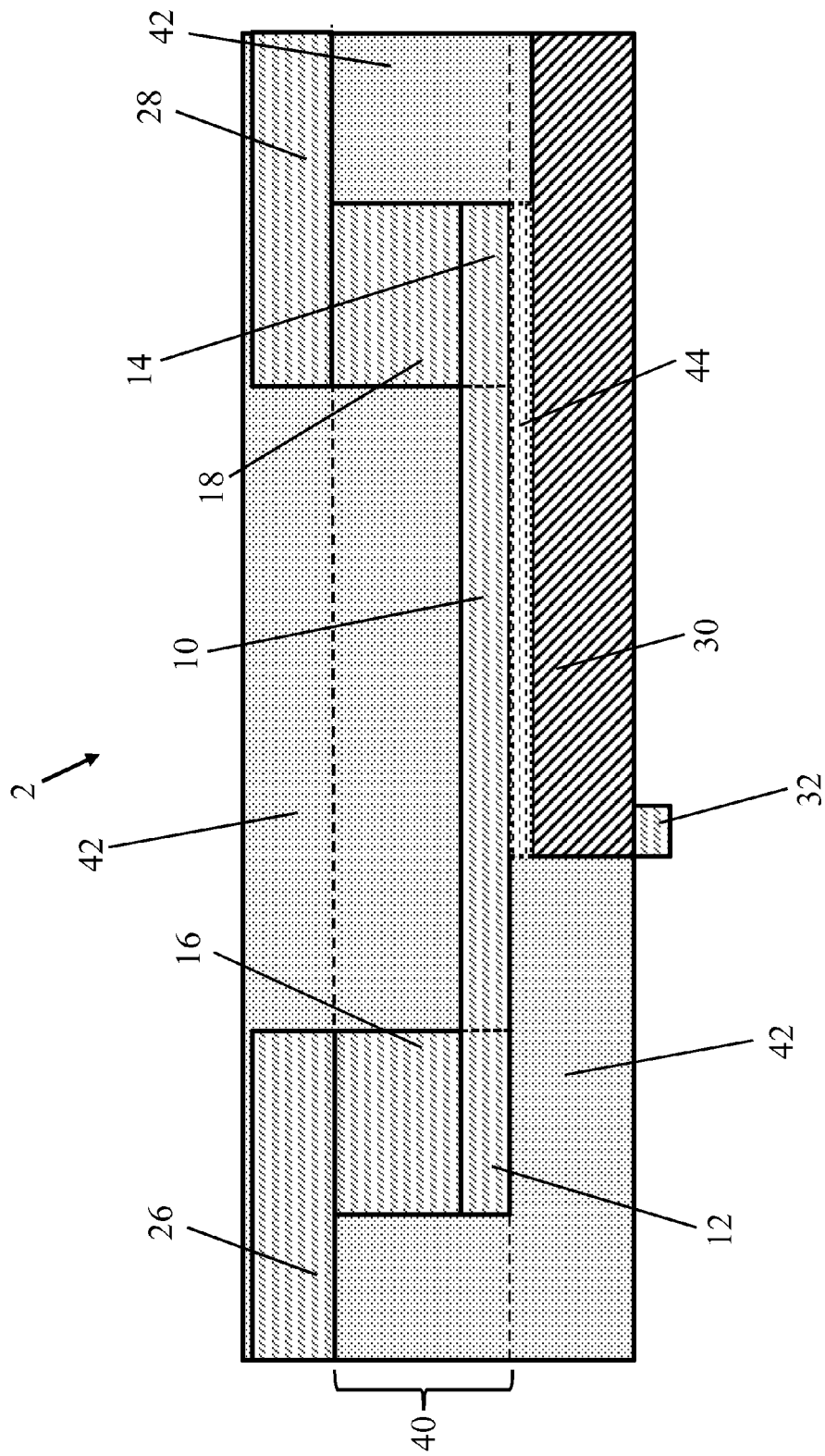
FIG. 1 shows a cross-sectional diagram of an e-fuse structure according to an embodiment of the invention.

Referring to the drawings, FIG. 1 depicts an e-fuse structure 2 according to an embodiment of the invention. E-fuse structure 2 can include an electrical fuse link 10 with a first electrode 12 and a second electrode 14 at opposite ends (shown by phantom lines in FIG. 1). First electrode 12 can electrically couple electrical fuse link 10 to a first via 16. Second electrode 14 can electrically couple electrical fuse link 10 to a second via 18. A "via," as used in this specification, refers to a metal-filled hole connecting two or more metal layers of a semiconductor. Alternatively, first electrode 12 can be coupled to second via 18, or second electrode 14 can be coupled to first via 16.

First and second vias 16, 18 can allow a current, including a "fusing current," to pass through e-fuse structure 2, including electrical fuse link 10. Some components of e-fuse structure 2, including electrical fuse link 10, and/or vias 16, 18 can be made from electrically conductive materials or metals, such as copper.

A "fusing current" may differ from other electric currents by having particular magnitudes of current, voltage, or pulse time. For example, a fusing current may be between approximately 22.0 mA and approximately 27.2 mA. Voltage drop across an electrical fuse link from a fusing current may correspondingly have a value between approximately 1.7 V and approximately 2.2 V. A fusing current can be provided as a single pulse of electric current across e-fuse structure 2, for example, over a time of approximately ten microseconds.

First via 16 can be coupled to a first wire 26. Second via 18 can be coupled to a second wire 28. In embodiments where vias 16, 18 are absent, first wire 26 can be coupled directly to first electrode 12, and second wire 28 can be coupled directly to second electrode 14. First wire 26 and second wire 28 can each be coupled to other components (not shown) inside and outside of a semiconductor structure. In still other embodiments, first wire 26 can be coupled to second electrode 14 or second via 18. Second wire 28 can similarly be coupled to first electrode 12 or first via 16.

First and second wires 26, 28 can be wires configured for use in a back end layer of a semiconductor structure. The structure of a back end metal layer, in which first and second wires 26, 28 and/or e-fuse structure 2 can be used, is described elsewhere herein. First and second wires 26, 28 can be made of metal for use in a back end layer of a semiconductor structure, such as copper.

A metal dummy structure 30 can be substantially aligned with at least a portion of electrical fuse link 10. The term "dummy structure" can refer to any placeholder component, including a metal component, within a semiconductor structure. A "dummy structure" can be provided during BEOL processes, and may provide no operational purpose in a semiconductor structure. Further, a "dummy structure" can be electrically disconnected from components of a semiconductor structure or integrated circuit.

As used herein, the term "substantial alignment" refers to any complete or partial vertical alignment at which dummy structure 30 can absorb heat from a portion of electrical fuse link 10. In this manner, metal dummy structure 30 can act as a heat sink. Electrical fuse link 10 can increase in temperature as electrical currents pass through it. Metal dummy structure 30, in response, can cool portions electrical fuse link 10 with which it is substantially aligned. Although FIG. 1 depicts metal dummy structure 30 as being below electrical fuse link 10, metal dummy structure 30 can also be at other locations (e.g., next to or above electrical fuse link 10). Examples of alternative locations for metal dummy structure 30 are discussed elsewhere herein. Metal dummy structure 30 can include any currently known or later developed material capable of acting as a heat sink in a semiconductor system, including an electrically conductive dummy structure. Specifically, metal dummy structure 30 can include tungsten, aluminum, copper, or other metal substances. In addition, metal dummy structure 30 may also include other materials or "impurities" without affecting its properties.

In some embodiments, metal dummy structure 30 can also include a dummy via 32. Dummy via 32 can allow electric currents to pass through metal dummy structure 30. In some embodiments, dummy via 32 may be absent. In embodiments where dummy structure 30 is located below each metal layer of a semiconductor system, electric currents may enter dummy structure 30 from gate or source/drain areas of a transistor (not shown) without dummy via 32. Electric currents passing through metal dummy structure 30 can have properties similar to or different from the fusing currents described elsewhere herein, without affecting the properties of e-fuse structure 2.

In addition, both electrical fuse link 10 and/or dummy structure 30 can be located within a back end layer 40 of a semiconductor. Back end layer 40 can be added to a semiconductor structure during a BEOL operation. The "back end" of a semiconductor can include one or more back end layers 40 that include a metal, such as copper, therein. Other structures included in back end layer 40 can be limited to wires, vias, (e.g., first and second vias 16, 18) and fuse components (e.g., electrical fuse link 10). Back end layer 40 can also include an "interlayer dielectric" 42 to divide and electrically insulate several back end layers 40 from each other.

In embodiments of the present disclosure, the term "interlayer dielectric" can refer to any electrically insulative substance capable of structurally dividing two or more back end layers of a semiconductor. Interlayer dielectrics 42 may include but are not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant material (i.e., having a dielectric constant of approximately 3.9 or less), or layers thereof.

In some embodiments, back end layer 40 can be one of several "metal layers" in a semiconductor. Back end layer 40, even when referred to as a "metal layer," can include interlayer dielectric 42. Further, back end layer 40 can be a "lower metal layer." The term "lower metal layer" can refer to a back end layer 40 separated from a silicon layer of a semiconductor structure by only few (or none) of the other back end layers. In other embodiments, back end layer 40 can be distal to a silicon layer and adjoin another back end layer 40 on only one side. The number of back end layers 40 in a semiconductor structure in which e-fuse structure 2 is used can vary between embodiments, and may include, for example, four to six metal layers or as many as, in a further example, sixteen metal layers.

In some embodiments, interlayer dielectric 42 can electrically insulate electrical fuse link 10 from metal dummy structure 30. In general, interlayer dielectric 42 electrically insulates components of back end layer 40 not otherwise electrically coupled to one another. Interlayer dielectric 42 can reduce parasitic capacitance or inductance in back end layer 40 that would otherwise result from current being allowed to travel between uncoupled components.

Although interlayer dielectric 42 may separate electrical fuse link 10 from metal dummy structure 30, other embodiments may provide a different structure. In one embodiment, a portion of electrical fuse link 10 can be in direct physical contact with dummy structure 30 at contact area 44 (shown in phantom). For example, metal dummy structures 30 made of tungsten can contact an electrical fuse link 10 made from a different material, such as copper. In this case, some current may cross from electrical fuse link 10 into metal dummy structure 30, but this amount will not be significant because tungsten has a significantly higher resistivity than copper. In addition or alternatively, any desired liner material or alloy material may be provided between metal dummy structure 30 and electrical fuse link 10. For example, liner material or alloy material may be provided within contact area 44.

Figure 2:
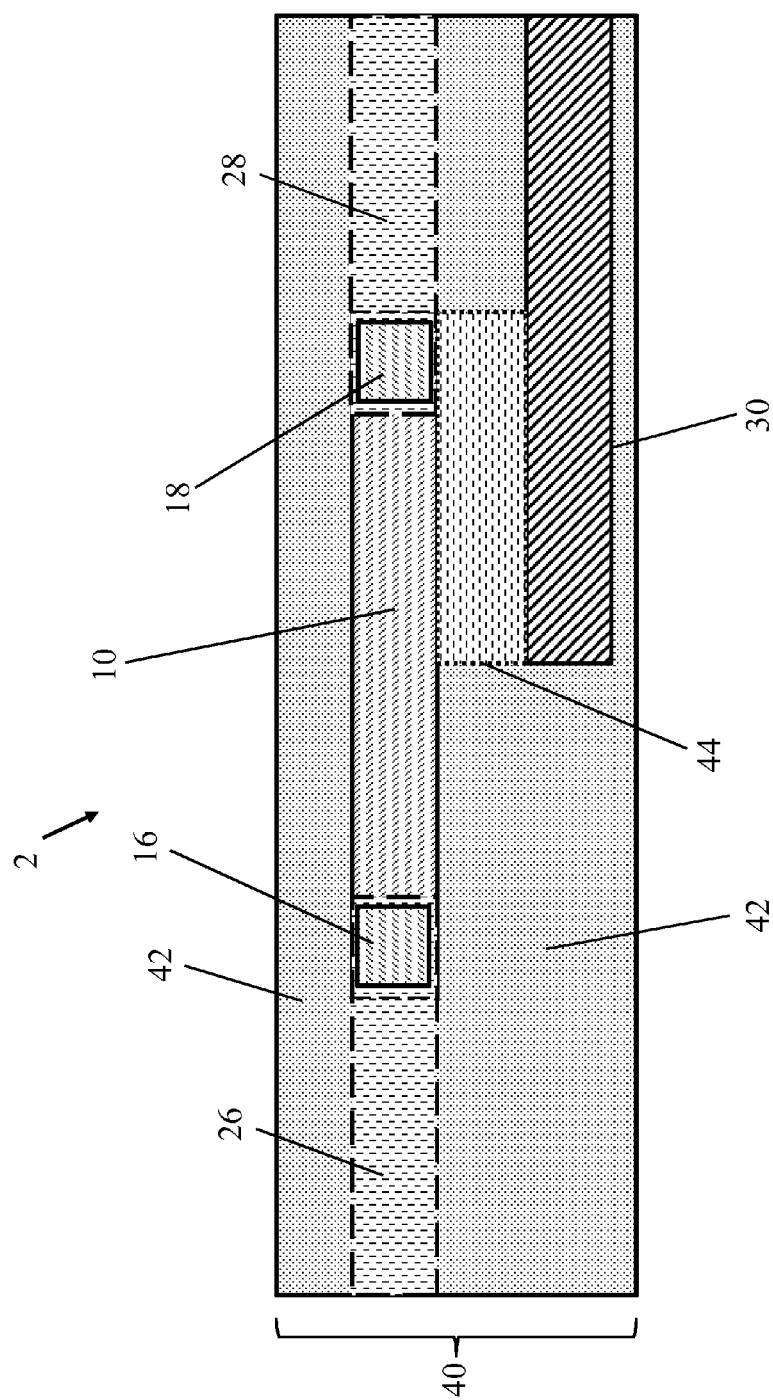
FIG. 2 shows a top-down cross-sectional diagram of an e-fuse structure according to an embodiment of the invention.

In FIG. 2, a top-down view of an embodiment of e-fuse structure 2 is shown. In some embodiments, shown by example in FIG. 2, dummy structure 30 can be positioned alongside electrical fuse link 10. Similar to other embodiments described herein, metal dummy structure 30 can be substantially aligned with electrical fuse link 10. Metal dummy structure 30 can optionally contact electrical fuse link 10 by at least partially being located within contact area 44.

Although metal dummy structure 30 may be positioned alongside electrical fuse link 10 in some embodiments, the operation of e-fuse structure 2 may remain substantially unchanged. If desired, each of metal dummy structure 30, portions of interlayer dielectric 42, and electrical fuse link 10 may be located within the same back end layer 40. In addition, first and second wires 26, 28 (shown in phantom) may be positioned above or below electrical fuse link 10. Vias 16, 18 may couple electrical fuse link 10 to first and second wires 26, 28. Although vias 16, 18 are shown by example in FIG. 2 as narrower than first and second wires 26, 28, vias 16, 18 can alternatively be broader than wires 26, 28 if desired.

Figure 3:
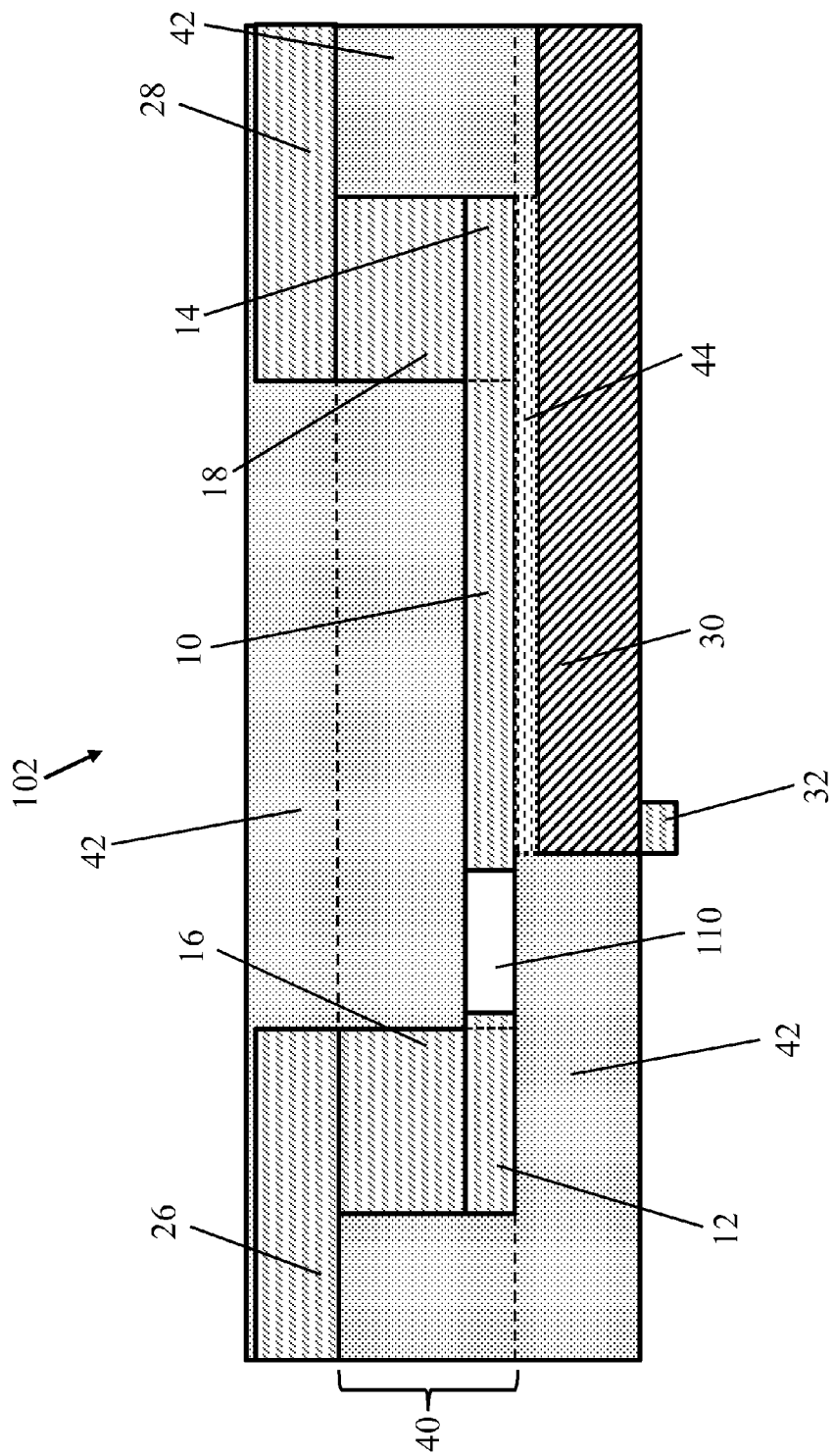
FIG. 3 shows a cross-sectional diagram of a fused e-fuse structure according to an embodiment of the invention.

Turning to FIG. 3, an electrically fused structure 102 according to an embodiment of the invention is shown. A void 110 can form in a portion of electrical fuse link 10 not substantially aligned with metal dummy structure 30. Void 110 is an electrically insulative zone of electrically fused structure 102 that prevents electric current from traveling between first electrode 12 and second electrode 14. Void 110 is a result of "fusing" e-fuse structure 2, and can serve practical purposes. For example, e-fuse structures 2 and fused structure 102 can be a form of non-volatile memory (NVM) within a semiconductor. For instance, several e-fuse structures 2 can be programmed by creating voids 110 in selected units to record "one" or "zero" data values. This data remains intact after a device is turned off and can store unit-specific information, such as serial numbers.

The mechanics by which void 110 can appear in an e-fuse structure 2 (FIGS. 1, 2) to form an electrically fused structure 102 are disclosed. In general, void 110 can form in e-fuse structure 2 by "electromigration."

Electromigration is a process in which atoms of a material, such as a metal, physically move out of areas where current density is very high. "Current density" refers to a ratio of electric current over a given cross-sectional area or volume of wire. Electromigration is caused primarily by frictional force between metal ions and flowing electrons. This frictional force between atoms can cause material to migrate away from an area. Eventually, electromigration can lead to an empty space (e.g., void 110) appearing in a layer such as back end layer 40.

To enhance electromigration, electrical fuse link 10 can have a narrower cross sectional area than wires 26, 28. Atoms of electrical fuse link 10, when subjected to a fusing current, may travel outside of electrical fuse link 10 through electrodes 12, 14 and enter adjoining vias 16, 18, wires 26, 28, or other components (not shown). As a result, void 110 can form in electrical fuse link 10.

Metal dummy structure 30 can enhance void formation due to electromigration. Metal dummy structure 30, by being substantially aligned with a portion of electrical fuse link 10, can absorb heat from the portion. At the same time, portions of electrical fuse link 10 not in alignment with metal dummy structure 30 are not cooled. As a result, the temperature of electrical fuse link 10 will increase at portions not substantially aligned with metal dummy structure 30. Embodiments of the disclosure have shown that electromigration may increase in regions of electrical fuse link 10 having a higher temperature value than others.

As described herein, metal dummy structure 30 can cool a portion of electrical fuse link 10 with which it is substantially aligned. This feature may cause a temperature difference or "thermal gradient" between different portions of electrical fuse link 10. A temperature difference between the cooled portions of electrical fuse link 10 can localize void formation due to electromigration in portions of electrical fuse link 10 with higher temperatures.

Void 110 can form in portions of electrical fuse link 10 where metal dummy structure 30 does not absorb heat. Specifically, voiding can occur in portions of electrical fuse link 10 that reach a temperature of at least approximately 800° C. when subjected to specific amounts of electric current (e.g., a fusing current) after approximately ten microseconds. In other embodiments, void 110 may appear in portions of electrical fuse link 10 that reach lower temperatures after being subjected to electric current over longer periods of time. Void 110 can appear in at least one location not in substantial alignment with metal dummy structure 30. Further, the formation of void 110 does not influence the properties of metal dummy structure 30. As a result, void 110 can appear in predictable locations, based on where metal dummy structure 30 is located in back end layer 40.

In an embodiment, vias 16, 18 can be provided at each electrode 12, 14 of e-fuse structure 2 (FIGS. 1, 2), and electrically fused structure 102, as described elsewhere herein. Vias 16, 18 can include electrically and thermally conductive materials, such as metal. Vias 16, 18 can accumulate heat when an electric current is directed through e-fuse structure 2. As a result, vias 16, 18 can act as additional heat sinks to increase the temperature difference between various portions of electrical fuse link 10. In particular, vias 16, 18 can increase the temperature difference between portions of electrical fuse link 10 substantially aligned with metal dummy structure 30, and portions of electrical fuse link not substantially aligned with metal dummy structure 30. Vias 16, 18 may be either narrower or wider than wires 26, 28, depending on the process use to fabricate vias 16, 18. In embodiments where vias 16, 18 are narrower than wires 26, 28, each via 16, 18 may become hotter than wires 26, 28 when subjected to electric current as a result of higher current densities being contained therein.

As described elsewhere herein, metal dummy structure 30 can be used for purposes other than aiding electromigration. For example, metal dummy structure 30 can also be used to monitor leakage of materials, such as copper. A user can apply a constant voltage between dummy structure 30 and electrodes 12, 14 to determine the properties of back end layer 40 from the amount of current passing through metal dummy structure 30. In addition, metal dummy structure 30 can be connected to other components (not shown) in a semiconductor structure.

Figure 4:
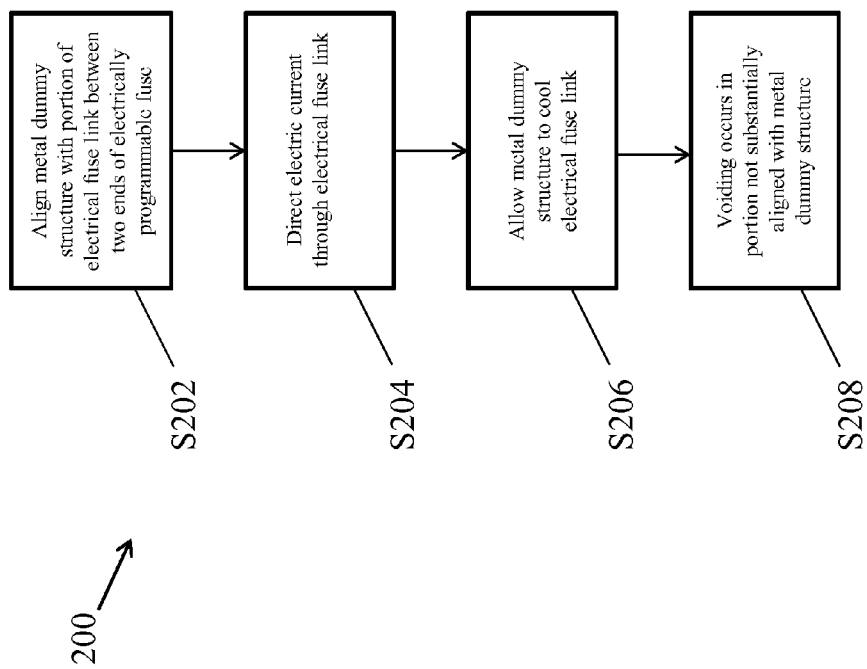
FIG. 4 shows an example flow diagram of a method for fusing an e-fuse structure according to an embodiment of the invention.

Turning to FIG. 4, an example flow diagram illustrating a method 200 of fusing an electrically programmable fuse (e.g., e-fuse structure 2 (FIGS. 1, 2)), is shown. A user (e.g., a manufacturer, an assembler, etc.) can substantially align a metal dummy structure 30 (FIGS. 1-3) with an electrical fuse link 10 (FIGS. 1-3) between two electrodes 12,14 (FIGS. 1-3) of an e-fuse structure 2 (FIGS. 1, 2) in step S202. The aligning in step S202 can occur within a back end layer 40 (FIGS. 1-3) of a semiconductor, specifically in a back end layer 40 that includes metal such as copper. Any currently known or later developed semiconductor manufacturing process may be employed to perform this step.

In some embodiments, metal dummy structure 30 (FIGS. 1-3) can be placed in direct physical contact with electrical fuse link 10 (FIGS. 1-3). A metal dummy structure 30 (FIGS. 1-3), in direct physical contact with a portion of electrical fuse link 10 (FIGS. 1-3) can include tungsten or other metal different from the material used in electrical fuse link 10. As discussed elsewhere herein, some electrical current may travel from electrical fuse link 10 (FIGS. 1-3) into metal dummy structure 30 (FIGS. 1-3) because of each being in direct physical contact. In this case, using the amount of current would not be sufficient to affect the fusing of electrical fuse link 10 (FIGS. 1-3) because metal dummy structure 30 (FIGS. 1-3) has a higher resistivity.

Method 200 can also include directing an electric current through electrical fuse link 10 (FIGS. 1-3) in step S204. The electric current directed in step S204 can, for example, cause a portion of electrical fuse link 10 (FIGS. 1-3) to reach a temperature of at least approximately 800° C. after flowing through electrical fuse link 10 over a period of approximately ten microseconds. In other embodiments, the electric current directed in step S204 can be directed over a different period and cause electrical fuse link 10 to reach a different temperature. Specifically, the electric current can be a fusing current having magnitudes of current, voltage, and pulse time described elsewhere herein. The electric current can be directed in step S204 by coupling a current carrying wire (e.g. a copper wire) or an electric signal to an e-fuse.

In some embodiments, a user of method 200 can obtain a semiconductor structure in which metal dummy structure 30 (FIGS. 1-3) and electrical fuse link 10 (FIGS. 1-3) are substantially aligned. For instance, one user may fabricate a semiconductor structure which includes a metal dummy structure 30 in substantial alignment with an electrical fuse link 10. A different user may direct an electric current through electrical fuse link 10. In this case, a user may begin method 200 at step S204.

As discussed elsewhere herein, metal dummy structure 30 (FIGS. 1-3) can absorb heat and thereby cool portions of electrical fuse link 10 (FIGS. 1-3) in response to an electric current flowing through electrical fuse link 10. Through substantial alignment between metal dummy structure 30 (FIGS. 1-3) and electrical fuse link 10 (FIGS. 1-3), a metal dummy structure 30 can cool a portion of electrical fuse link 10 in step S206. The cooling in step S206 can create a temperature difference or "thermal gradient" between portions of electrical fuse link 10 (FIGS. 1-3).

Methods of fusing according to an embodiment of method 200 can include, in step S208, forming a void 110 (FIG. 3) in a portion of electrical fuse link 10 (FIGS. 1-3) not substantially aligned with metal dummy structure 30 (FIGS. 1-3). As described elsewhere herein, voiding caused by electromigration within e-fuse 2 (FIGS. 1-2) can be enhanced by a temperature difference between various portions of electrical fuse link 10 (FIGS. 1-3). Thus, a user of method 200 can form void 110 (FIG. 3) at predictable locations.

Figure 5:
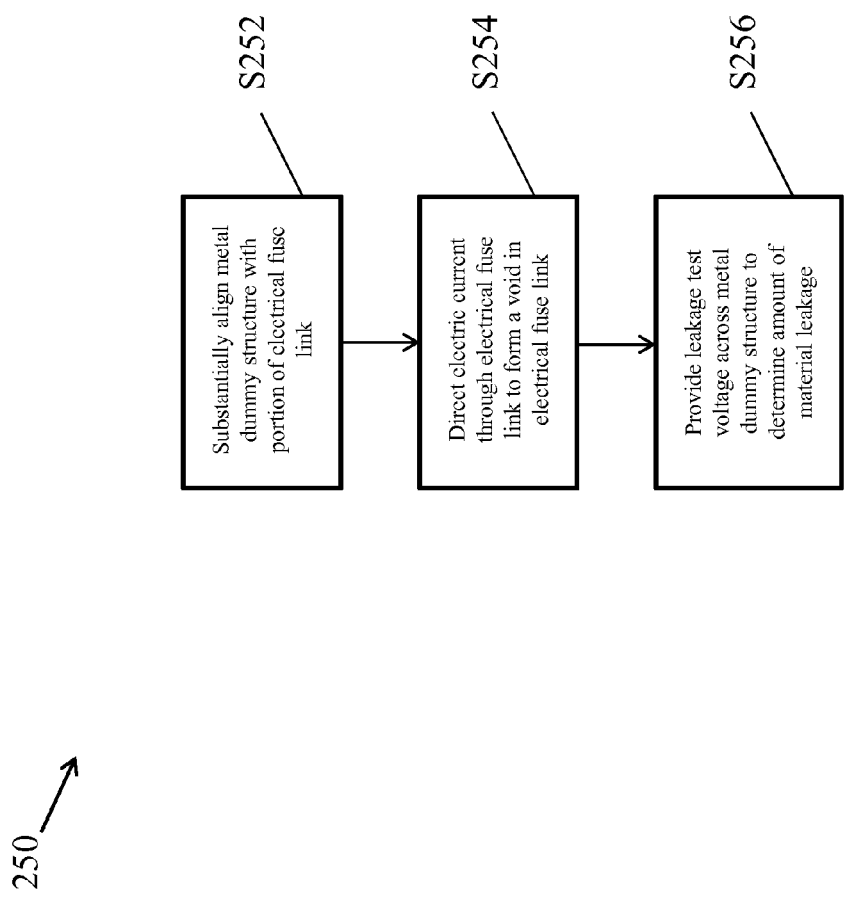
FIG. 5 shows an example flow diagram of a method for monitoring material leakage according to an embodiment of the invention.

Turning to FIG. 5, an example flow diagram of a method 250 for monitoring material leakage in a semiconductor is provided. Metal dummy structure 30 (FIGS. 1-3) can be used to monitor the leakage of materials such as copper in a semiconductor. This feature can allow users to determine whether degradation has caused materials (e.g., copper) to leak from back end layer 40 (FIGS. 1-3). Materials leaking from some layers (e.g., back end layer 40, FIGS. 1-3) of a semiconductor structure may contaminate other layers, such as silicon layers.

A user of method 250 can substantially align metal dummy structure 30 (FIGS. 1-3) in step S252 with a portion of an electrical fuse link 10 (FIGS. 1-3). A user can then, in step S254, direct an electric current through electrical fuse link 10 (FIGS. 1-3) to form a void 110 (FIG. 3) in electrical fuse link 10. Over time, materials may leak from one or more metal layers 40 (FIGS. 1-3) because of structural instability caused by activities such as fusing an e-fuse and/or the presence of void 110 (FIG. 3). As a result, the resistance of components in back end layer 40 (FIGS. 1-3) may decrease over time. As resistance decreases, electric current flow at a constant voltage will increase. Therefore, the changing content of back end layer 40 can be monitored by measuring current through metal dummy structure 30 (FIGS. 1-3).

To monitor material leakage in a semiconductor containing a fused structure 102 (FIG. 3), a user of method 250 in step S256 can provide a leakage test voltage across metal dummy structure 30 (FIGS. 1-3). A leakage test voltage may be applied by way of dummy via 32 (FIGS. 1, 3) or other electrical couplings to metal dummy structure 30 described herein. In step S256 of method 250, a user can provide a set DC voltage, such as approximately 1 V, across metal dummy structure 30 (FIGS. 1-3). For example, resultant currents per unit length of dummy metal structure 30 exceeding approximately 100 nA/um can signify a leakage of copper from back end layer layer 40. Thus, method 250 can allow a user to monitor whether a conductive material (e.g., copper) from back end layer 40 (FIGS. 1-3) has contaminated other structures of a semiconductor structure, including interlayer dielectric 42.

In some embodiments, a user of process 250 may obtain an existing semiconductor structure in which void 110 is already present within electrical fuse link 10. For example, a first user (e.g., a person or machine) may create void 110 within electrical fuse link 10, before a second user performs method 250 upon the resulting structure to monitor material leakage. In these situations, a user may begin method 250 at either of steps S254 and S256.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An e-fuse structure comprising:
   a metal dummy structure;
   an electrical fuse link substantially vertically aligned with a first portion of the metal dummy structure,
   wherein the metal dummy structure cools at least the first portion of the electrical fuse link in response to an electric current passing through the electrical fuse link; a first electrode coupled to a first end of the electrical fuse link; and a second electrode coupled to a second end of the electrical fuse link, such that the electrical fuse link electrically couples the first electrode to the second electrode, wherein the metal dummy structure is positioned laterally between the first and second electrodes, and wherein the electrical fuse link is sized to form a void in a second portion of the electrical fuse link not substantially vertically aligned with the metal dummy structure as an electric current passes therethrough.

2. The e-fuse structure of claim 1, wherein the void forms in the further portion at a temperature of at least approximately 800° C. in response to being subjected to the electric current over a period of approximately ten microseconds.

3. The e-fuse structure of claim 1, wherein the metal dummy structure comprises at least one of tungsten, aluminum, and copper.

4. The e-fuse structure of claim 3, wherein the metal dummy structure further comprises an electrical line configured to communicate an electric current.

5. The e-fuse structure of claim 1, wherein the metal dummy structure is in physical contact with the electrical fuse link.

6. The e-fuse structure of claim 1, further comprising:
a via electrically coupled to the electrical fuse link, the via acting as a heat sink for the electrical fuse link in response to the electric current passing through the electrical fuse link.

7. The e-fuse structure of claim 1, further comprising an interlayer dielectric contacting each of the electrical fuse link and the metal dummy structure.

8. The e-fuse structure of claim 1, wherein the electric current is a fusing current.

9. The e-fuse structure of claim 1, wherein the electrical fuse link is electrically coupled to a copper wire structure.

10. The e-fuse structure of claim 1, wherein the electrical fuse link comprises copper.

11. The e-fuse structure of claim 1, wherein a dielectric electrically insulates the electrical fuse link from the metal dummy structure.

* * * * *